US009885865B2

(12) United States Patent
Ishii

(10) Patent No.: US 9,885,865 B2
(45) Date of Patent: Feb. 6, 2018

(54) PACKAGE IMPLEMENTED WITH PCB AND TRANSPARENT SUBSTRATE TO CONTAIN AND PROTECT A MEMS DEVICE

(71) Applicant: Fusao Ishii, Pittsburg, PA (US)

(72) Inventor: Fusao Ishii, Pittsburg, PA (US)

(73) Assignee: Fusao Ishii

( * ) Notice: Subject to any disclaimer, the term of this patent is extended or adjusted under 35 U.S.C. 154(b) by 610 days.

(21) Appl. No.: 13/831,819

(22) Filed: Mar. 15, 2013

(65) Prior Publication Data
US 2014/0268300 A1  Sep. 18, 2014

(51) Int. Cl.
*G02B 26/00* (2006.01)
*G02B 26/08* (2006.01)
*B81B 7/00* (2006.01)

(52) U.S. Cl.
CPC ........ *G02B 26/0833* (2013.01); *B81B 7/0067* (2013.01); *B81B 2207/097* (2013.01)

(58) Field of Classification Search
CPC .......................... G02B 26/0833; B81B 7/0067
USPC ......... 359/198.1–199.4, 200.6–200.8, 202.1, 359/221.2, 223.1–225.1, 226.2, 904, 359/290–295, 838, 846, 871, 872; 250/204, 559.06, 559.29, 230, 234; 347/255–260; 353/39, 98–99; 385/15–18, 22; 398/12, 19, 45
See application file for complete search history.

(56) References Cited

U.S. PATENT DOCUMENTS

| | | | | |
|---|---|---|---|---|
| 6,704,131 | B2 * | 3/2004 | Liu ..................... | G02B 26/0841 174/50 |
| 2005/0275930 | A1 * | 12/2005 | Patel .................. | G02B 26/0841 359/291 |
| 2006/0233498 | A1 * | 10/2006 | Soskind ............... | G01J 1/04 385/88 |
| 2008/0296697 | A1 * | 12/2008 | Hsu ................... | H01L 23/49827 257/379 |

* cited by examiner

*Primary Examiner* — Bumsuk Won
*Assistant Examiner* — Tamara Y Washington
(74) *Attorney, Agent, or Firm* — Bo-In Lin

(57) ABSTRACT

The present invention provides a flip-chip package for MEMS device without time consuming wire-bonding. Bonding a silicon chip to a printed circuit board can be achieved by restricting the heat deformation of printed circuit board with adhered glass substrate which has similar heat expansion coefficient as silicon.

14 Claims, 8 Drawing Sheets

PACKAGE IMPLEMENTED WITH PCB AND TRANSPARENT SUBSTRATE TO CONTAIN AND PROTECT A MEMS DEVICE

This application is a Non-provisional application claiming a Priority date of Mar. 17, 2012 based on a previously filed Provisional Application 61/685,379. The disclosures made in Patent Application 61/685,379 filed by the same Applicant of this Non-Provisional application are hereby incorporated by reference in this patent application.

BACKGROUND OF THE INVENTION

1. Field of the Invention

The present invention relates generally to packages for MEMS (Micro Electro Mechanical System) and manufacturing the same. More particularly, this invention relates to packages for MEMS devices by sealing the MEMS portion of device hermetically to keep the inside of package dry to avoid the stiction of moving parts. The combination of printed circuit board (PCB), transparent substrate, and MEMS device enables the next generation of MEMS display devices. Flip-Chip packaging of MEMS device using Printed Circuit Board (PCB) and transparent substrate is described here.

2. Description of the Relevant Art

Micro-mirror devices have drawn considerable attention in their use as Spatial Light Modulators (SLM). A spatial light modulator requires an array of a relatively large number of such micro-mirror devices. In general, the number of devices required ranges from 60,000 to several million for each SLM. Despite significant advances that have been made in recent years, there is still a need for improvement in the performance and manufacturing yields of electromechanical micro-mirror devices.

One critical engineering challenge encountered by those of ordinary skill in the art is in the connection of the MEMS-CMOS system (mirror system) to a printed circuit board interface that is easily mounted to enable the transfer of power and data as the interface between the power source and image signal input device. Specifically, a typical device employs a packaging configuration generally known as wire bonding wherein individual wires are connected between the mirror system and the interface for receiving power and signals transmitted through these bonding wires.

One limiting factor for implementing the wire-bonding packaging configuration arises from the physical space required for connecting and extending a large number of bonding wires between a miniaturized mirror device and the interface connection terminals. The space limitation is even more critical now because there is significant demand for smaller micro-mirrors, so called Pico-projectors. For such small mirror device, the physical space required to transfer data is limited by the small size of the mirror system. There is also significant demand to increase the amount of data transferred to the mirror system because the amount of data transferred often directly impacts the ability to create greater depth of brightness (pixel bit-rate) as well as the number of pixels on the image to generate images of high resolution. In order to achieve the image display of high image quality either by implementing smaller micro-mirror devices to achieve miniaturized device size, or implementing micro-mirror devices with higher resolution and increasing bit-rate, the space limitation becomes a bottle neck. For the purpose of satisfying current trends of image display, there is a need that requires alternative packaging configuration for electrically connecting the mirror system to an interface.

Another limiting factor arises from the cost of production required for wire bonding. Each pad on the MEMS-CMOS must be physically connected to a counterpart on the interface. The wire bonding process is now mechanized, but the process still limits production yield and the complicated structure causes the production cost to increase. For these reasons, wire bonding may still be a viable packaging configuration of producing micro-mirror devices if the number of wires is relatively low. However, as the need for data transfer increases, wire bonding is no longer a cost effective or technically feasible configuration of producing micro-mirror devices.

One solution to form the electrical connections between a mirror system to an interface is a packaging methodology called flip-chip packaging. In this methodology, bumps are placed on each mirror system pad that conventionally required a wire bonding connection and pads on the interface are approximated to the solder balls. The electrical connection is formed by first heating the solder balls followed by removing the heat for cooling down and solidifying the connections.

However, there are also limiting factors when the flip-chip configuration is implemented for forming the connections of the mirror devices. When the heat is applied to the bumps to make a permanent electrical connection between the mirror system and interface, both systems undergo a thermal expansion with the rise of the temperature. A problem is caused by the mismatch of thermal expansions between the mirror system that is made primarily of silicon and the interface that is most commonly formed on a printed circuit board, often made with plastic or fiber reinforced plastic. Specifically, the rate of heat expansion of silicon and plastic differ, an electrical coupling made at high temperatures will sense a shearing tension as the materials cool, ultimately breaking the coupling.

One method of circumventing this problem is to employ a Chip-on-Glass (print patterning of electrically conducting material on a glass substrate) and use flip-chip packaging to connect the mirror system to the glass substrate. Since glass and silicon have approximately the same heat expansion rates, no significant shearing tension is felt and the electrical couplings remain intact. However, printing circuits on glass is an expensive process and although this process may produce one or few well performed device as development samples, such processes have not matured into mass production manufacturing processes in order to produce commercially viable product.

For these reasons, there are still needs in the art of manufacturing image display devices to provide new and improved packaging configuration and manufacturing processes for MEMS device. The new and improved configuration and manufacturing processes must be able to produce micromirror devices that can transfer large amounts of data with limited physical space and can be manufactured with simplified process and lower costs such that the above discussed limitations and difficulties can be resolved.

SUMMARY OF THE PRESENT INVENTION

It is therefore an aspect of the present invention to provide new and improved device configurations to implement a surface mount packaging manufacturing processes to circumvent the difficulties of thermal expansion mismatches between the silicon substrate and the printed circuit board for directly mounting the mirror device substrate as a flip chip onto the PCB.

Specifically, it is an aspect of the present invention to provide a new and improved device configuration by wherein the PCB is adhered to a glass substrate which has closer heat expansion coefficient to silicon. The adhered PCB will have similar heat expansion as that of glass and this package can avoid the disconnection of bumps caused by thermal expansion mismatches such that the difficulties and limitations of the conventional packaging technologies of the MEMS mirror devices device can be overcome.

Briefly, in a preferred embodiment, the present invention discloses a MEMS package that comprises a silicon substrate supporting a MEMS device on the silicon substrate. The MEMs package further include a printed circuit board (PCB) having pads supported on the PCB. The silicon substrate further includes a plurality of bumps constituting conducting contact points between the MEMS device and the PCB. The PCB is further adhered to a glass substrate and the bumps are in contact and attached to the pads on the PCB through an adhesive material.

In summary this invention discloses a method for manufacturing a MEMS package. The method includes steps of a) forming a MEMS device as a flip chip; b) preparing a printed circuit board read to mount and connect the flip chip onto the PCB. c) preparing a glass substrate; and d) adhering the glass substrate to the bottom surface of the PCB whereby the PCB together with the glass substrate having substantially a similar thermal expansion coefficient as the flip chip.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
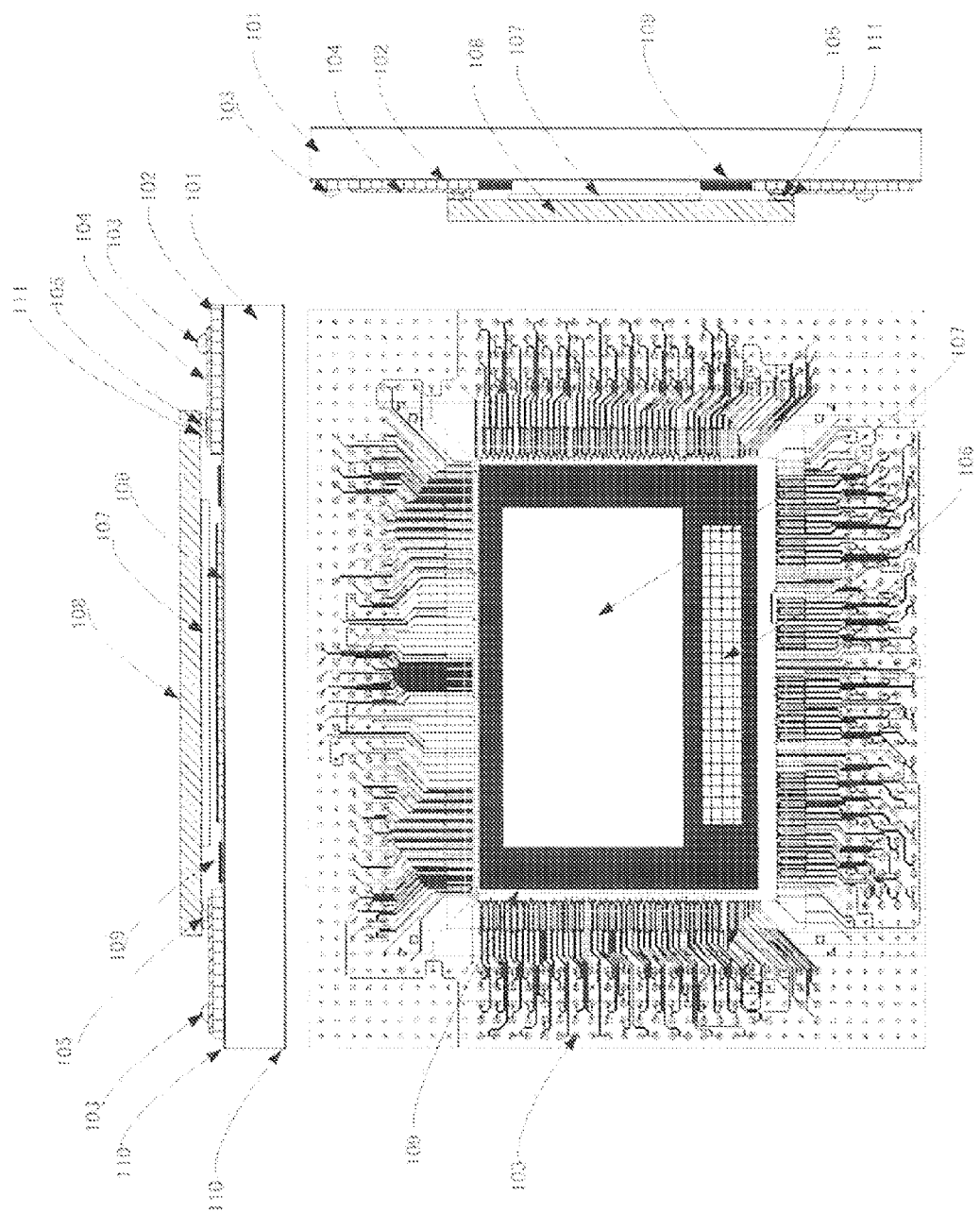
FIG. 1 shows a first embodiment of a MENS package of this invention.

A MEMS device, commonly manufactured on a silicon substrate with semiconductor circuits, has to be connected electrically to an external printed circuit board (PCB) to supply electrical power and control signals. Typically a MEMS device is packaged to connect to a printed circuit board made on or in a plastic substrate. FIG. 1 shows an embodiment of a package of this invention. A MEMS device 107 is formed on a MEMS portion on a silicon substrate 108. The MEMS device is placed on a printed circuit board (PCB) 102 that is typically made of plastic using materials such as polyimide or fiber reinforced plastic. The silicon substrate 101 is a transparent substrate to allow the incoming light to transmit through the substrate. The bumps 105 are attached to pads of the MEMS device. The MEMS device 108 with bumps 105 is bonded to the metal traces 104 with resin 111 such as ACF (Anisotropic Conductive Film), ACP (Anisotropic Conductive Paste), NCF (Non-Conductive Film) or NCP (Non-Conductive Paste). This process will eliminate time consuming wire-bonding process. It is very difficult to bond a silicon substrate to a PCB directly because the heat expansion coefficient of PCB is substantially higher than that of silicon substrate and the connection between the bumps and the metal traces are often disconnected due to the difference of heat expansion coefficients of silicon and plastic.

To prevent this disconnection problem, in this embodiment, a PCB (102) is adhered to a glass substrate (101). The glass substrate 101 has closer heat expansion coefficient to silicon. The adhered PCB will have similar heat expansion as that of glass and this package can avoid the disconnection of bumps. The solder balls 103 are formed on the PCB to connect this package to an external circuit. A coating layer of getter material (106) is applied onto the glass substrate 101 to absorb moisture to prevent the failures of the MEMS device caused by moisture inside the package. A layer of light shield (109) is coated onto the glass substrate 101 to reduce unnecessary light projected into the MEMS mirrors.

Figure 2:
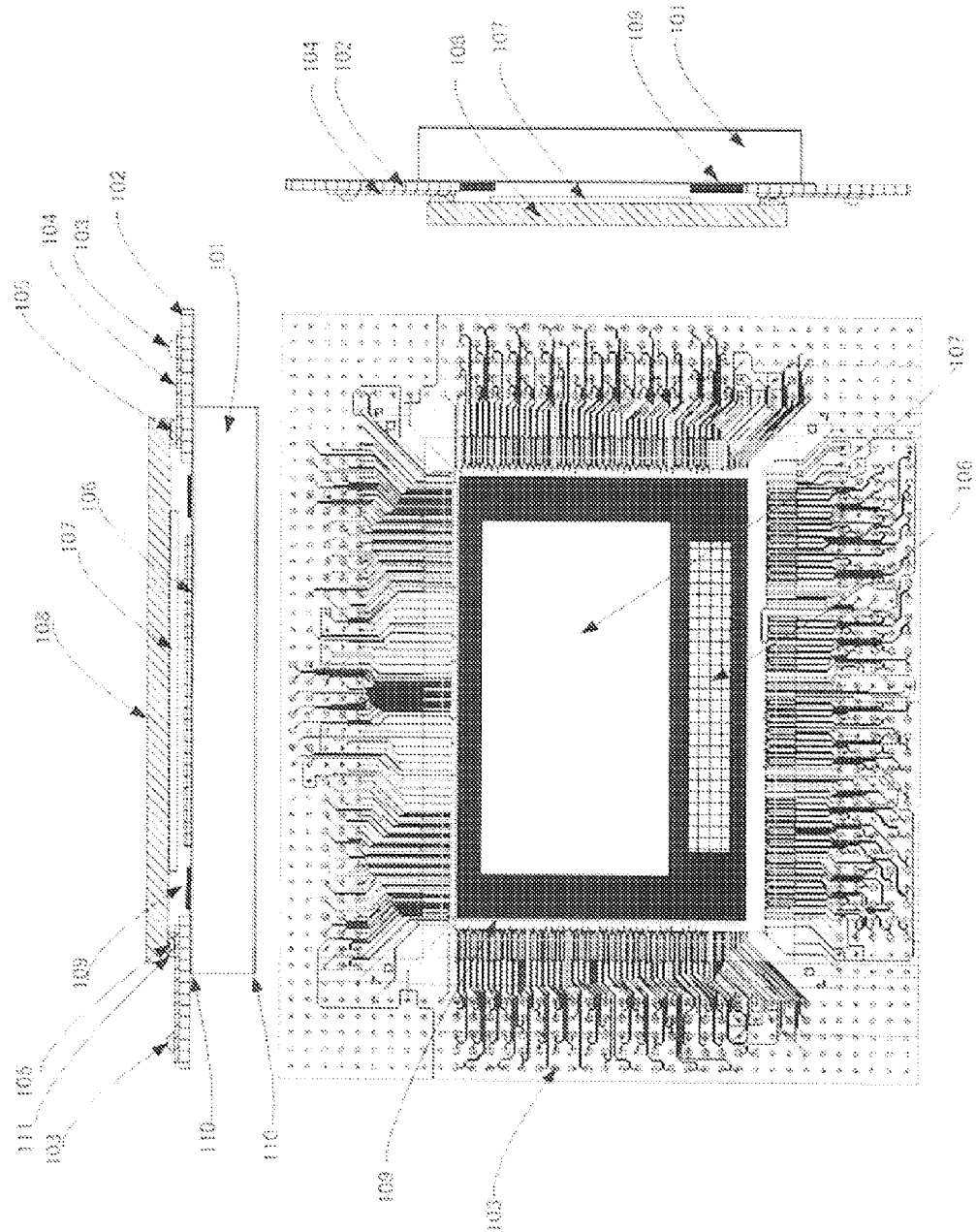
FIG. 2 shows a second embodiment of a MENS package of this invention.

FIG. 2 shows another embodiment of this invention. The package configuration is similar to that shown in FIG. 1 except that the external portion of PCB 102 is not adhered to a glass substrate 101, because the external portion of the PCB 102 does not contributes to reduce the heat expansion of PCB at the locations of bumps.

Figure 3:
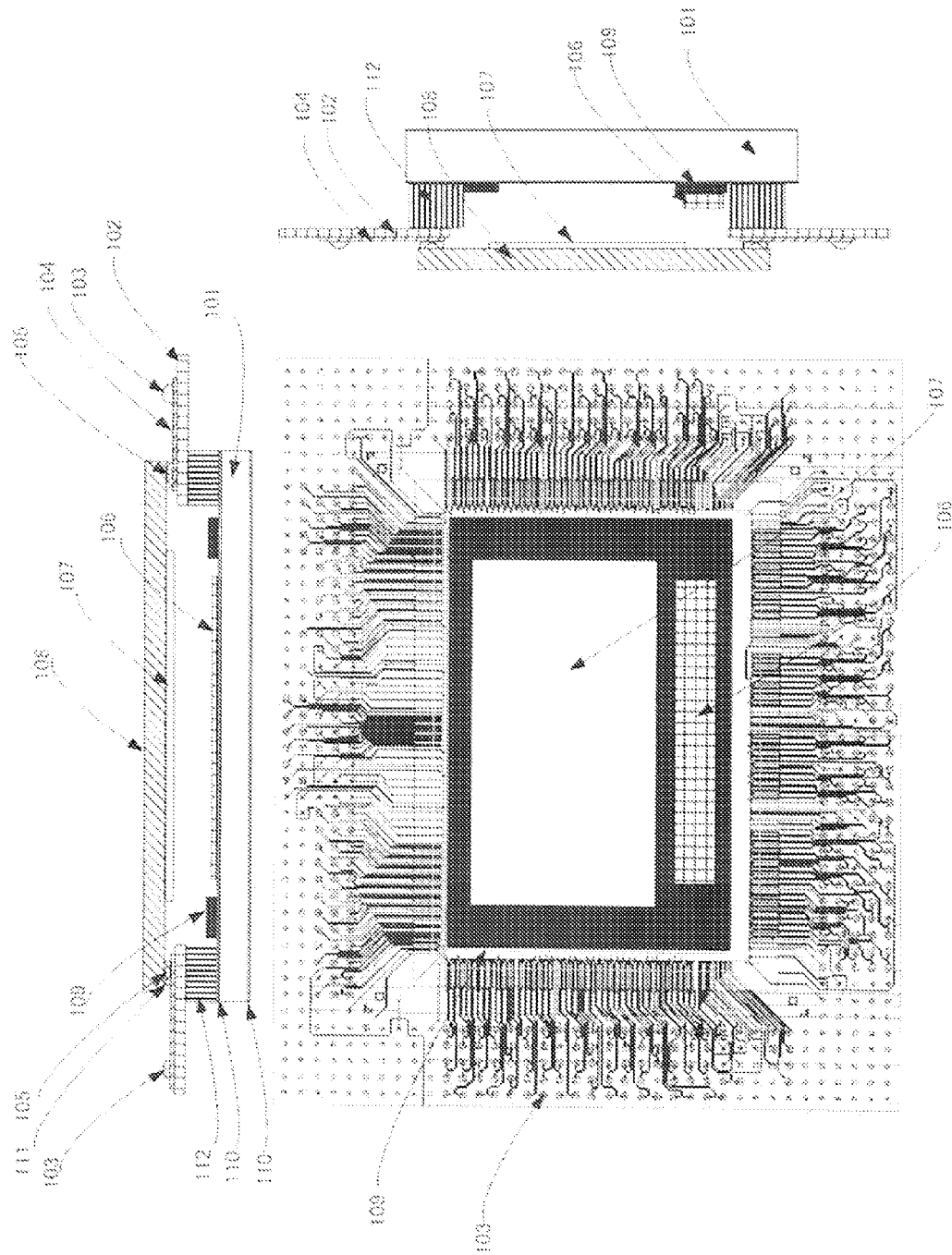
FIG. 3 shows a third embodiment of a MENS package of this invention.

FIG. 3 shows another embodiment of this invention. The package configuration is similar to that shown in FIG. 1 except that only portion of the PCB 102 that is near the bump 105 is adhered to a frame 112. The frame 112 is composed of a material having a close heat expansion coefficient to the silicon substrate 101. The material of frame can be metal such as aluminum or steel or it can be made of engineering plastic.

Figure 4:
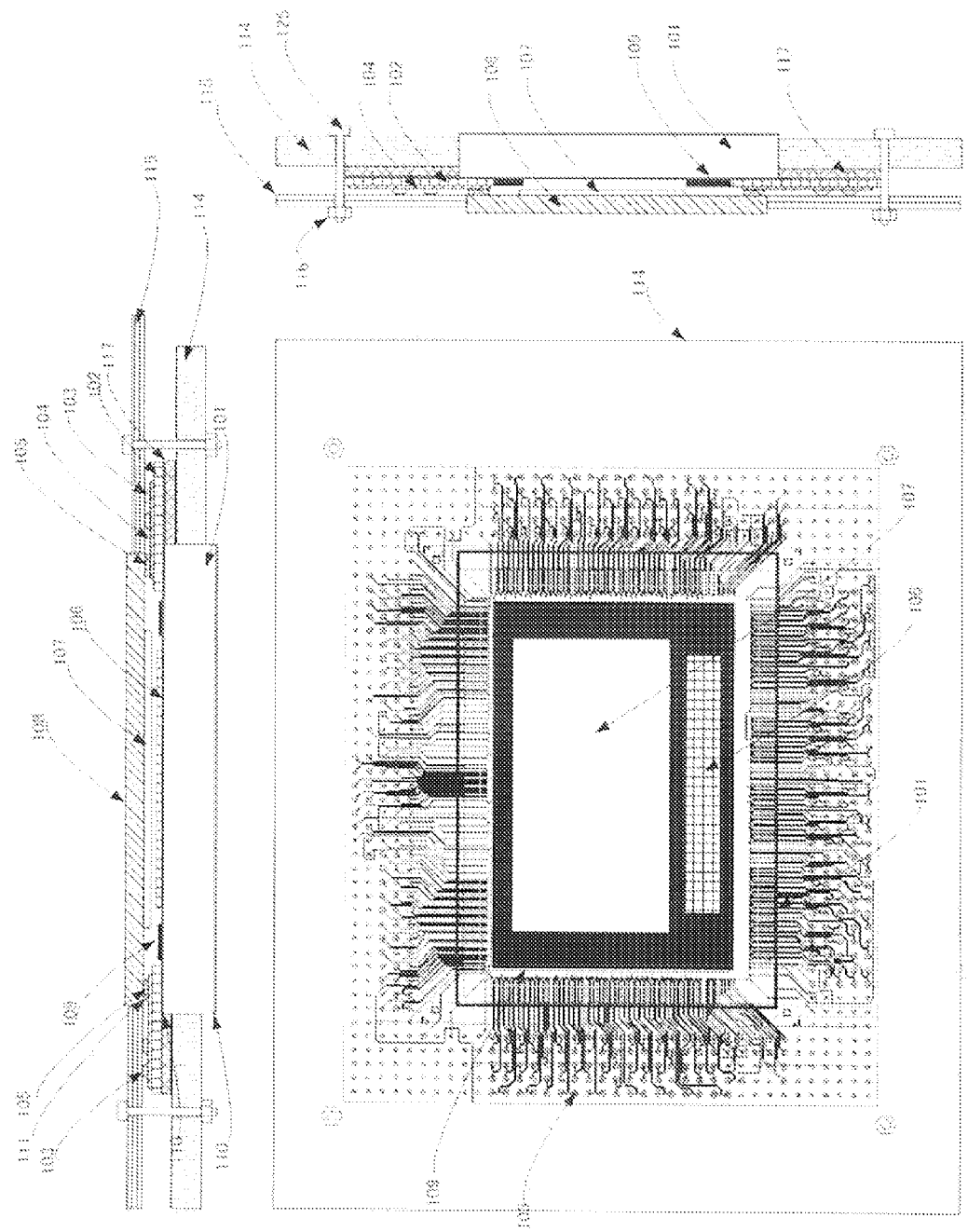
FIG. 4 shows a fourth embodiment of a MENS package of this invention.

FIG. 4 shows another embodiment of this invention wherein MEMS chip 108 is flip-chip bonded to PCB (102) and the PCB (102) is electrically connected to another PCB (115) wherein PCB 112 is a flexible PCB whereon silicon chip is bonded by glue or solder and 115 is a larger hard PCB which is a part of a projector circuit and the flexible PCB 112 has to be connected the hard PCB 115.) With mechanical pressure using a frame (114), elastic material (117) bolt 125 and nuts 116. Instead of mechanical pressure, these two PCBs can be soldered as well. The elastic material can be rubber sheet or soft plastic material such as silicon rubber.

Figure 5:
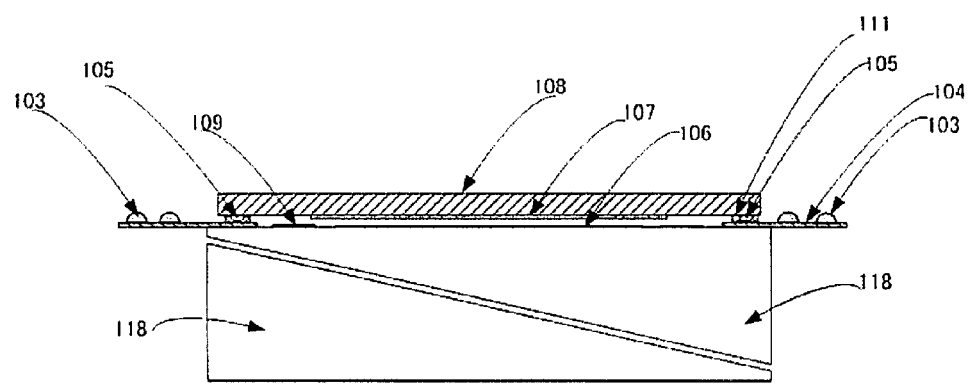
FIG. 5 shows a fifth embodiment of a MENS package of this invention.

FIG. 5 shows another embodiment of this invention wherein MEMS chip is flip-chip bonded to PCB (102) and the PCB (102) is mechanically connected to Total Internal Reflection Prism (TIR prism, 118). The usage of TIR prism will improve form factor of optical engine. The conventional method uses a flat cover glass and a pair of TIR prism. The purpose of flat cover glass is to seal the package to avoid dusts and external moisture. The bottom of TIR prism is flat, therefore we can avoid a flat cover glass for cost saving and shortening the distance between mirror array and projection lens, which improves the performance of magnification by the projection lens.

Figure 6:
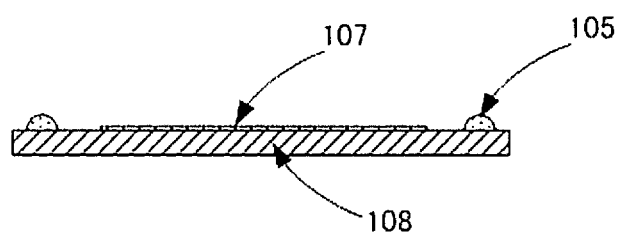
FIGS. 6 to 11 show the processing steps of manufacturing the MEMS package of this invention.

FIG. 6 to FIG. 10 shows an example of manufacturing process of this invention. FIG. 6 shows that a MEMS device 107 is formed on silicon substrate 108 and bumps 105 are applied onto the pads of the silicon substrate.

Figure 7:

FIG. 7 shows an example of PCB. PCB substrate (102) can be flexible polyimide and metal trace (104) can be glued on, the substrate or electroplated and patterned by lithography method. Photo-resist is coated over the metal trace and patterned to create openings for solder balls. Solder balls (103) can be glued in the openings and reflowed to connect the solder balls to the metal trace. As an alternative way, the solder balls 103 can be formed as conductive bumps instead of solder balls.

Figure 8:
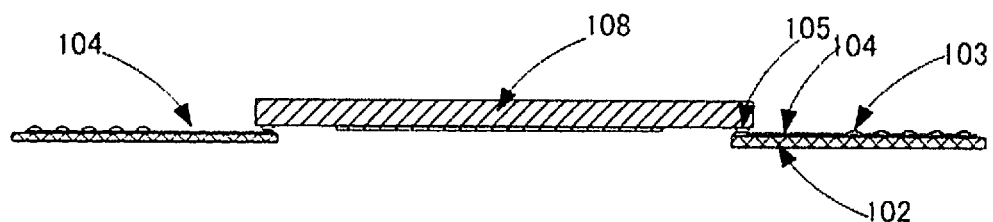

As shown in FIG. 8; the silicon substrate 108 with MEMS device 107 is configured as a flip-chip bonded onto the PCB 102 with ACF (Anisotropic Conductive Film), ACP (Anisotropic Conductive Paste), NCF (Nonconductive Film) or NCP (Nonconductive Paste).

Figure 9:
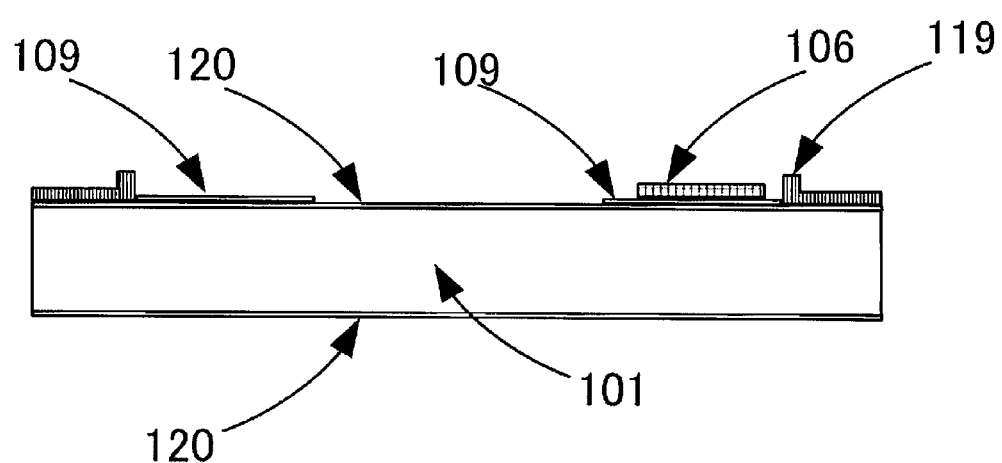

FIG. 9 shows how a glass substrate 101 is prepared. The glass substrate 101 is coated with AR (anti-reflective coating, 120). Then light shield (109) and a layer of getter material 106 is coated. A gasket 119 is glued, soldered or frit-sealed. A single glass substrate can contain multiple pieces and can be diced into piece.

Figure 10:
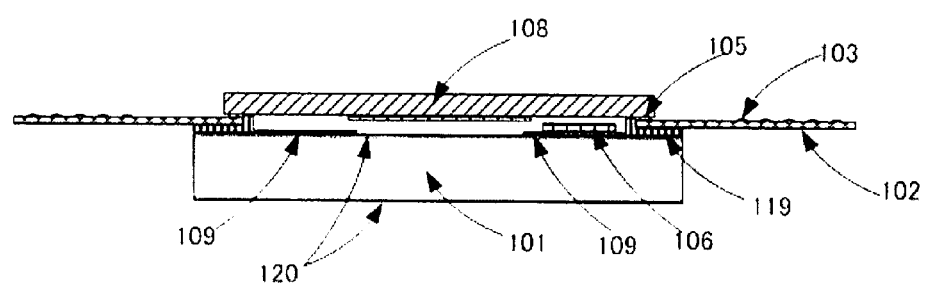

FIG. 10 shows how the glass substrate 101 and the PCB 102 are bonded. Glass and PCB can be glued, soldered, frit-sealed or mechanically tightened.

Figure 11:
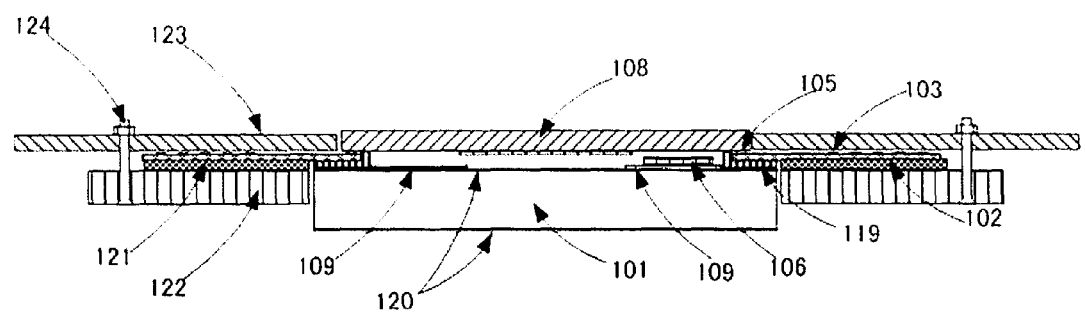

FIG. 11 illustrates an example how the package is connected to a hard PCB 123. In this case, the bumps of the flexible PCB 102 are bonded to silicon substrate 108 and connected to the pads of a hard PCB 123 with an elastic sheet 121 and frame 122 at the contact points 103 by squeezing a frame 122 and the hard PCB 123 with nuts and bolts (124).

Although the present invention has been described in terms of the presently preferred embodiment, it is to be understood that such disclosure is not to be interpreted as limiting. Various alternations and modifications, will no doubt become apparent to those skilled in the art after reading the above disclosure. Accordingly, it is intended that the appended claims be interpreted as covering all alternations and modification's as fall within the true spirit and scope of the invention.

What is claimed is:

1. A MEMS package for containing and protecting a MEMS device wherein the MEMS package comprising:
   a printed circuit board (PCB) having a MEMS device opening for placing and exposing the MEMS device through the MEMS device opening disposed on a center portion of the PCB wherein said MEMS device further having a plurality of conductive bumps disposed on a bottom surface near peripheral portions of the MEMS device;
   the PCB further comprises a plurality of conductive pads disposed on a top surface of the PCB around the MEMS device opening wherein the conductive pads having a exactly corresponding footprint as the conductive bumps of the MEMS for directly mounting each of conductive bumps onto the conductive pads and wherein the PCB further includes a polarity of conductive traces and each of the conductive traces extends laterally form the conductive pads on the top surface of the PCB to a solder ball disposed on an outer edge of the PCB; and
   a transparent substrate disposed below the PCB and adheres to a bottom surface of the PCB.

2. The MEMS package according to claim 1, wherein: the MEMS device is a mirror device comprising a plurality of micromirrors.

3. The MEMS package according to claim 1, wherein: the conductive bumps of the MEMS device are adhered to the conductive pads on the PCB by applying an adhesive material selected from a group of materials consisting of ACF (Anisotropic Conductive Film), ACP (Anisotropic Conductive Paste), NCF (Nonconductive Film) and NCP (Nonconductive Paste).

4. The MEMS package according to claim 1, further comprising:
   a layer of getter material coated on a surface of a transparent plate inside the MEMS package to absorbs moisture.

5. The MEMS package according to claim 1, further comprising:
   a light shield layer coated on a portion of a top surface of said transparent substrate facing the bottom surface of the PCB inside the MEMS package.

6. The MEMS package according to claim 1, wherein: the transparent substrate disposed below the PCB and extended over and adhered to an entire surface of the bottom surface of the PCB.

7. The MEMS package according to claim 1, wherein: the silicon substrate disposed below the PCB and extended over and adhered to only a part of the bottom surface of the PCB and covering the center portion up to an area underneath the conductive pads around the MEMS device opening.

8. The MEMS package according to claim 1, wherein: the transparent substrate comprises a glass substrate.

9. The MEMS package according to claim 1, wherein: the PCB is composed of a flexible material.

10. The MEMS package according to claim 1, wherein: the PCB is composed of a fiber reinforced plastic material.

11. The MEMS package according to claim 1, wherein: the PCB is composed of a polyimide material.

12. The MEMS package according to claim 1, wherein: the transparent plate is TIR (total internal reflection prism).

13. The MEMS package according to claim 1, wherein: the transparent substrate further directly contacts a heat sink with a thermally conductive thin layer disposed between the transparent substrate and the heat sink.

14. A MEMS package for containing and protecting a MEMS device wherein the MEMS package comprising:
   a printed circuit board (PCB) having a MEMS device opening for placing and exposing the MEMS device through the MEMS device opening disposed on a center portion of the PCB wherein said MEMS device further having conductive bumps disposed on a bottom surface near peripheral portions of the MEMS device;
   the PCB further comprises a plurality of conductive pads disposed on a top surface of the PCB around the MEMS device opening wherein the conductive pads having a exactly corresponding footprint as the conductive bumps of the MEMS for directly mounting each of conductive bumps onto the conductive pads and wherein the PCB further includes a polarity of conductive traces and each of the conductive traces extends laterally form the conductive pads on the top surface of the PCB to a solder ball disposed on an outer edge of the PCB;
   a frame disposed below and contacting a bottom surface of the PCB to support the PCB near an area below the conductive pads adhered to the conductive bumps; and
   a silicon substrate disposed below the frame adhere to a bottom surface of the frame wherein the frame is composed of a material having a heat expansion coefficient close to the silicon substrate.

* * * * *